United States Patent
Tetelbaum et al.

(10) Patent No.: US 6,611,951 B1
(45) Date of Patent: Aug. 26, 2003

(54) METHOD FOR ESTIMATING CELL POROSITY OF HARDMACS

(75) Inventors: Alexander Tetelbaum, Hayward, CA (US); Yevgeny Berdichevsky, La Jolla, CA (US)

(73) Assignee: LSI Logic Corporation, Milpitas, CA (US)

( * ) Notice: Subject to any disclaimer, the term of this patent is extended or adjusted under 35 U.S.C. 154(b) by 47 days.

(21) Appl. No.: 09/895,668

(22) Filed: Jun. 29, 2001

Related U.S. Application Data

(60) Provisional application No. 60/250,482, filed on Nov. 30, 2000.

(51) Int. Cl.[7] .............................................. G06F 17/50
(52) U.S. Cl. .............................. 716/12; 716/13; 716/14
(58) Field of Search ................................ 716/12, 13, 14

(56) References Cited

U.S. PATENT DOCUMENTS 6,405,358 B1 * 6/2002 Nuber ........................ 716/12

OTHER PUBLICATIONS

Hom, I, et al., "Estimation of the number of routing layers and total wirelength in a PCB through distribution analysis", IEEE, Sep. 1996, pp. 310–315.*

* cited by examiner

*Primary Examiner*—John F. Niebling
*Assistant Examiner*—Stacy A Whitmore
(74) *Attorney, Agent, or Firm*—Fitch, Even, Tabin & Flannery

(57) ABSTRACT

A method of estimating the number of available transit connections of a hardmac includes the steps of calculating a total layer capacity of the hardmac; calculating a number of available transit connections from the total layer capacity; estimating a number of transit connections used for internal routing; calculating an absolute porosity of the hardmac from the number of available transit connections and the number of transit connections used for internal routing; calculating a relative porosity of the hardmac from the total metal layer capacity and the absolute porosity; and generating as output the relative porosity of the hardmac as an estimated porosity.

30 Claims, 11 Drawing Sheets

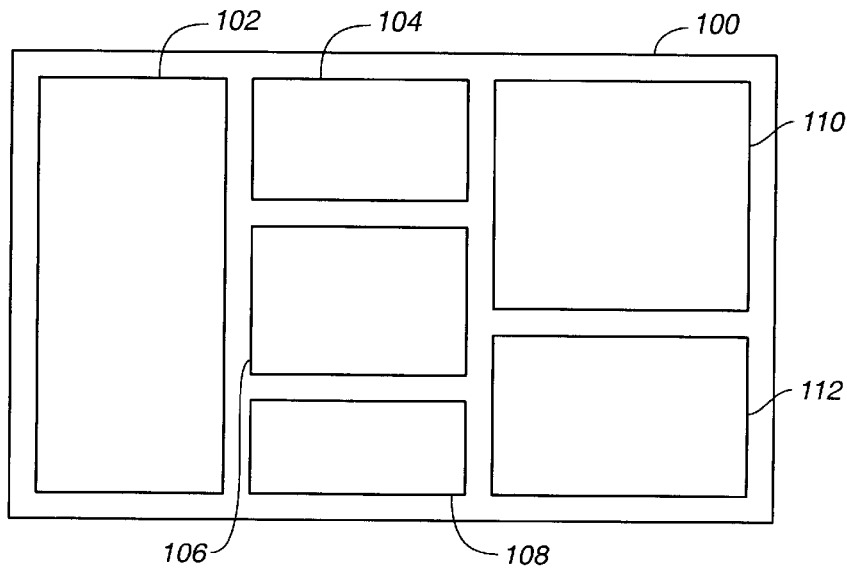
*FIG._1*
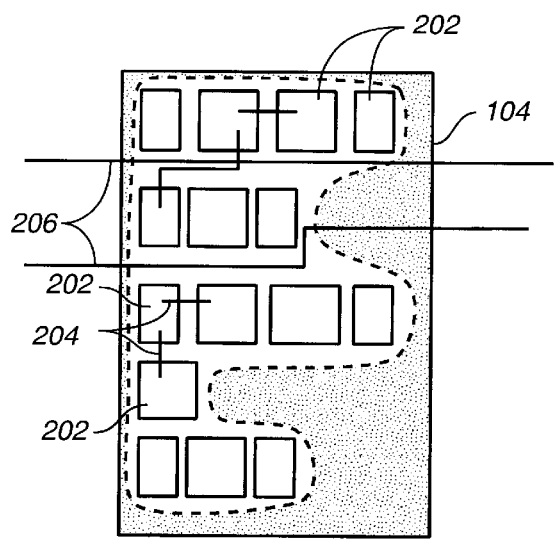
*FIG._2*
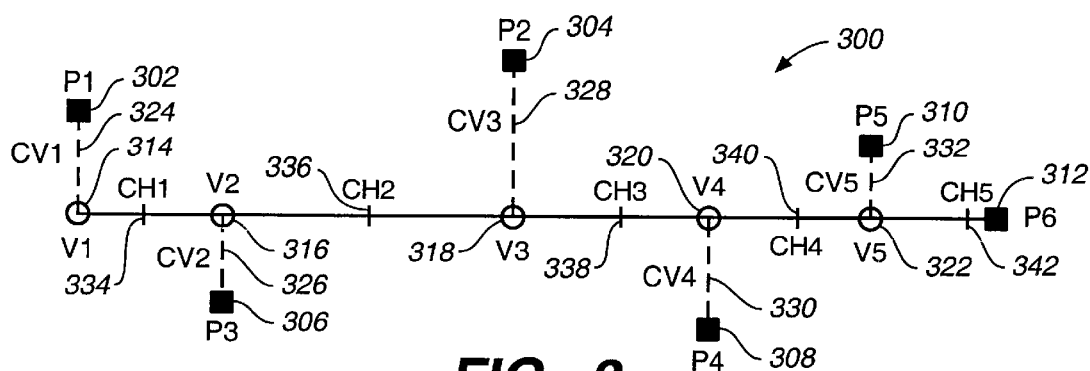
*FIG._3*

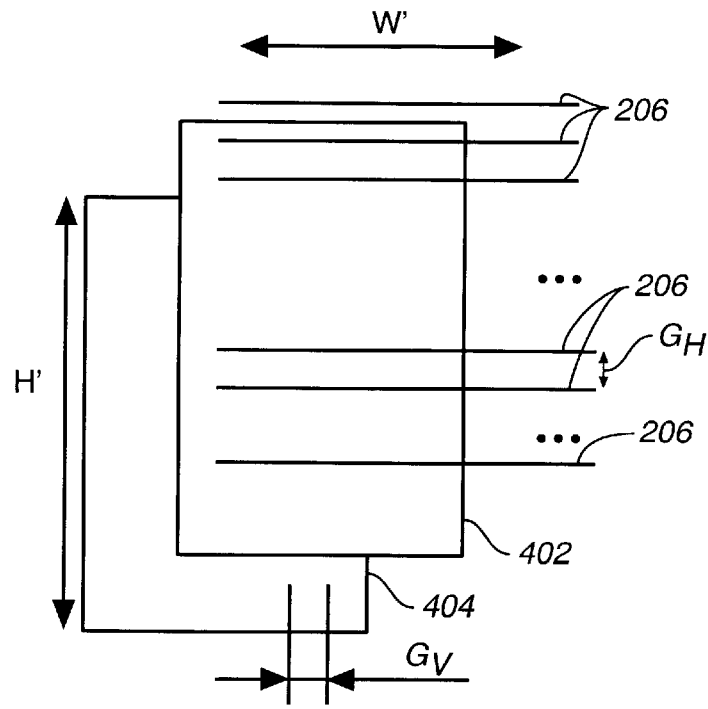
FIG._4
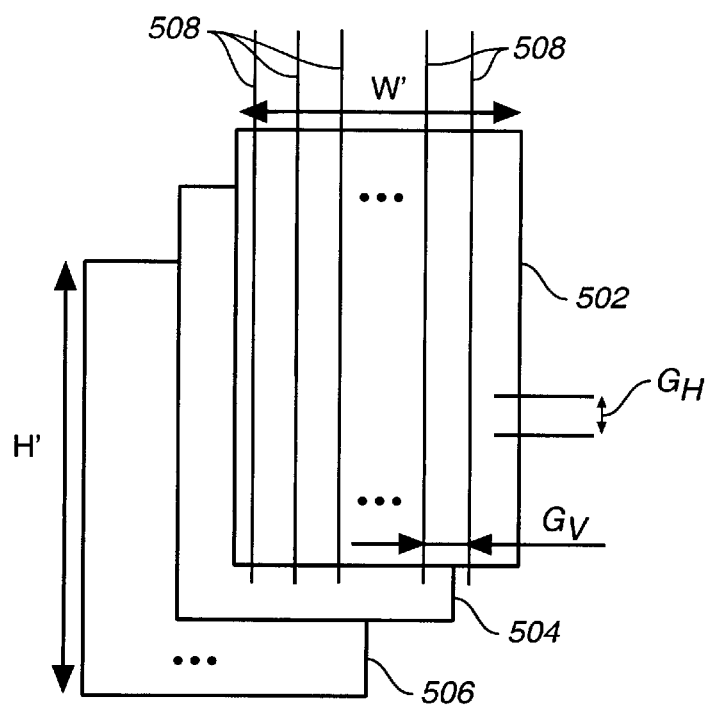
FIG._5

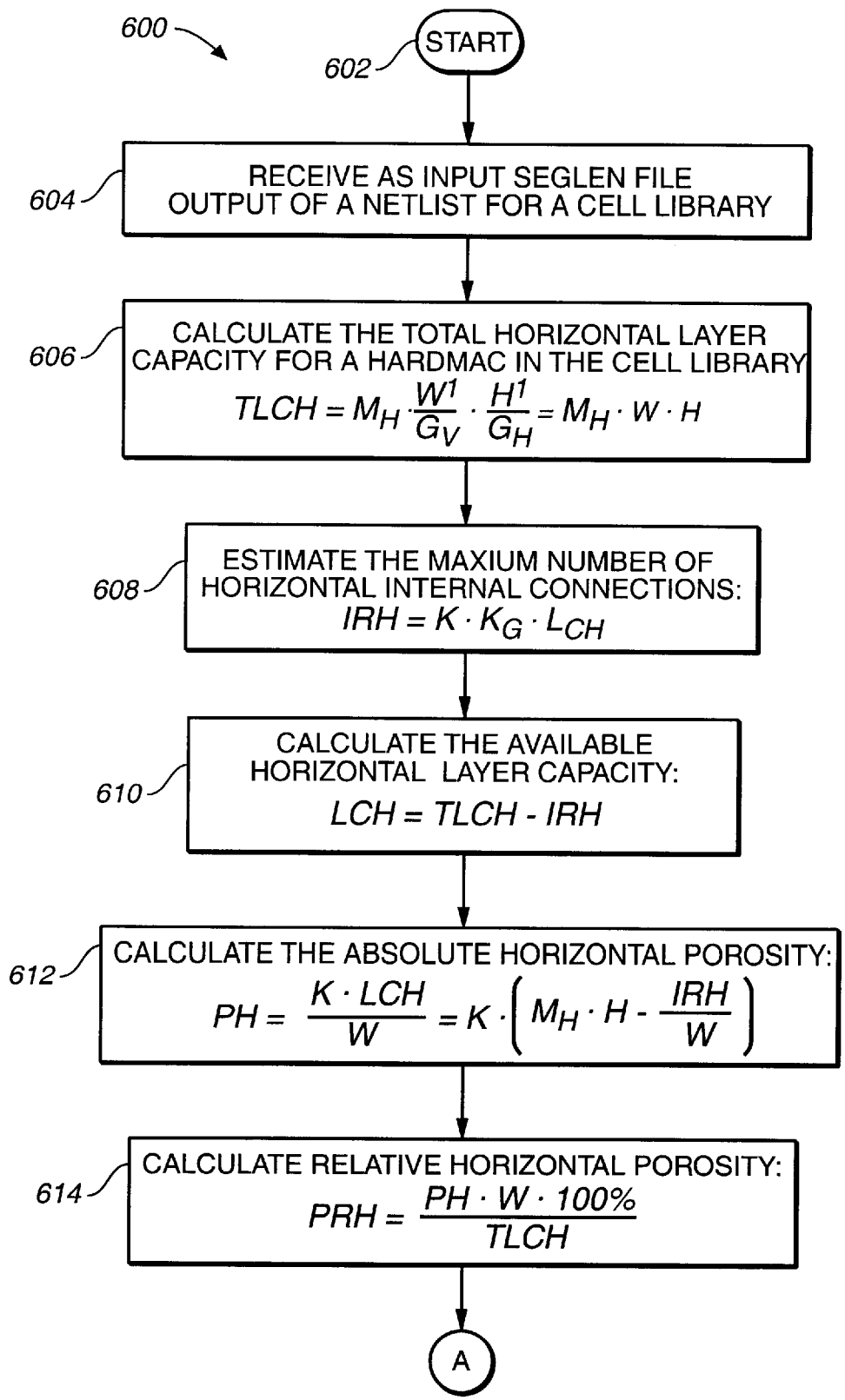
FIG._6A

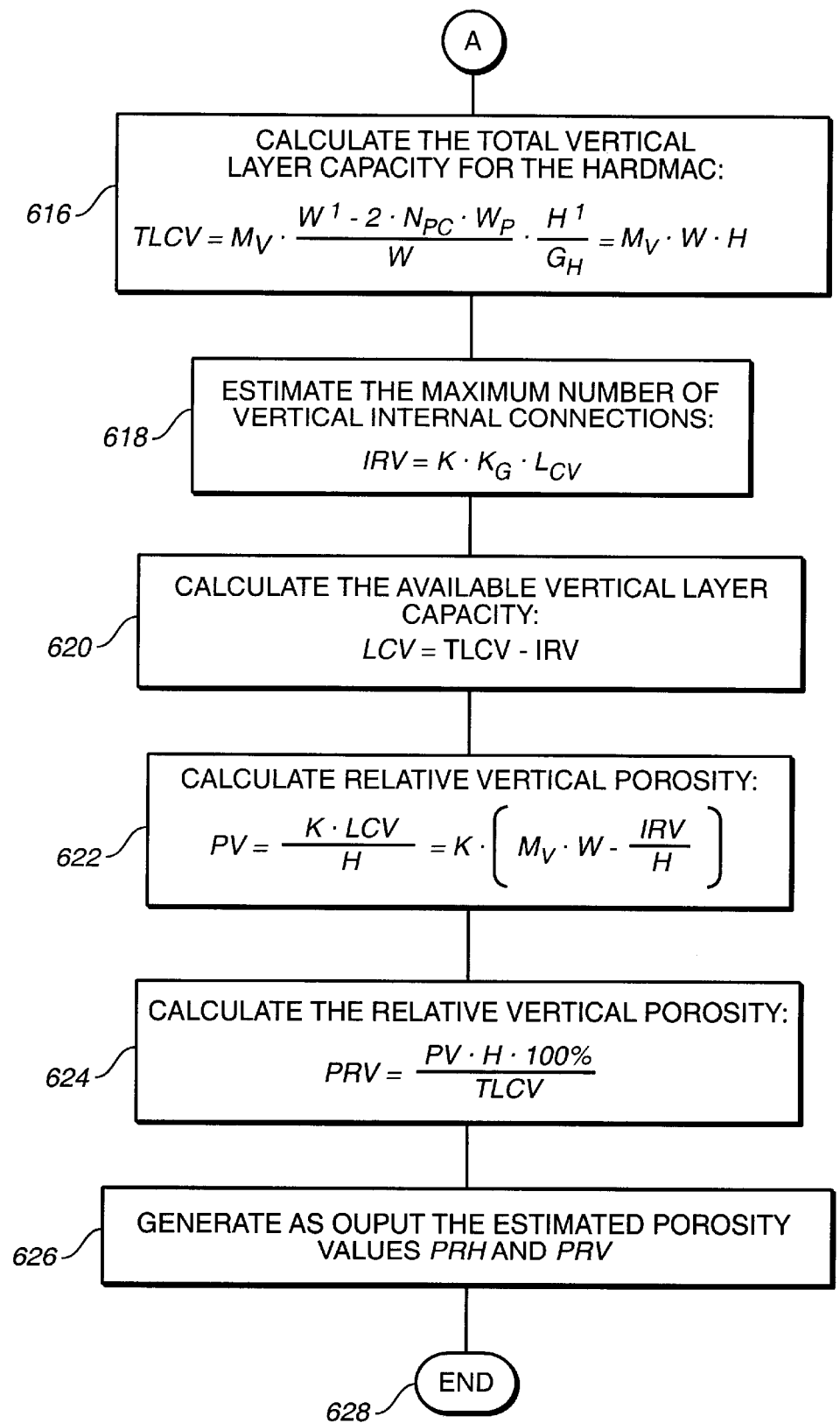
FIG._6B

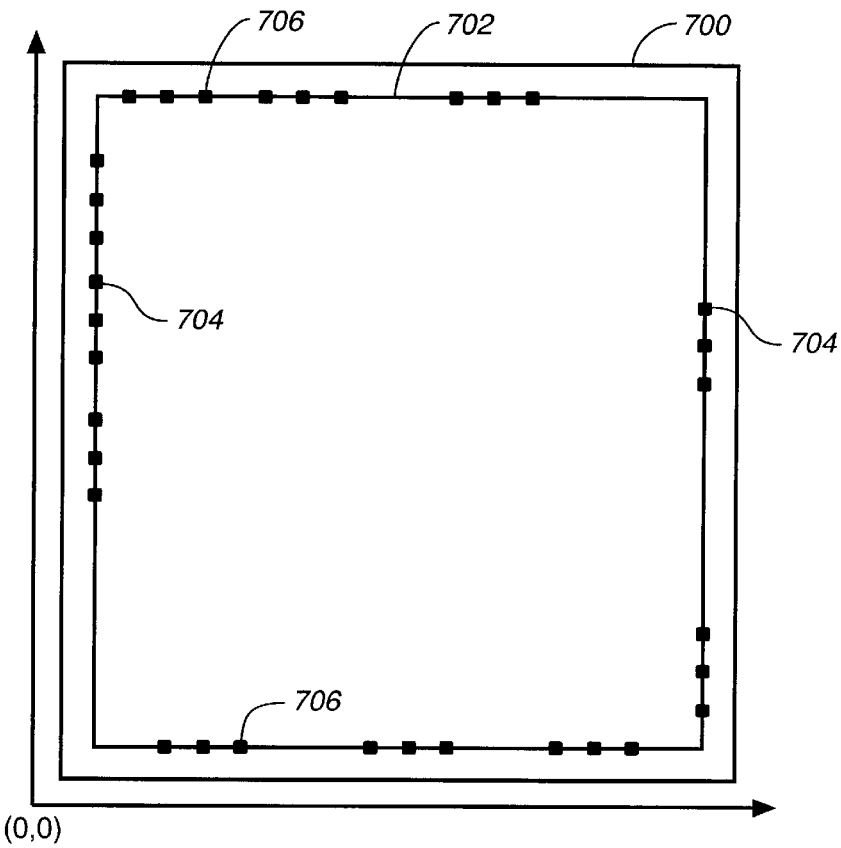
FIG._7
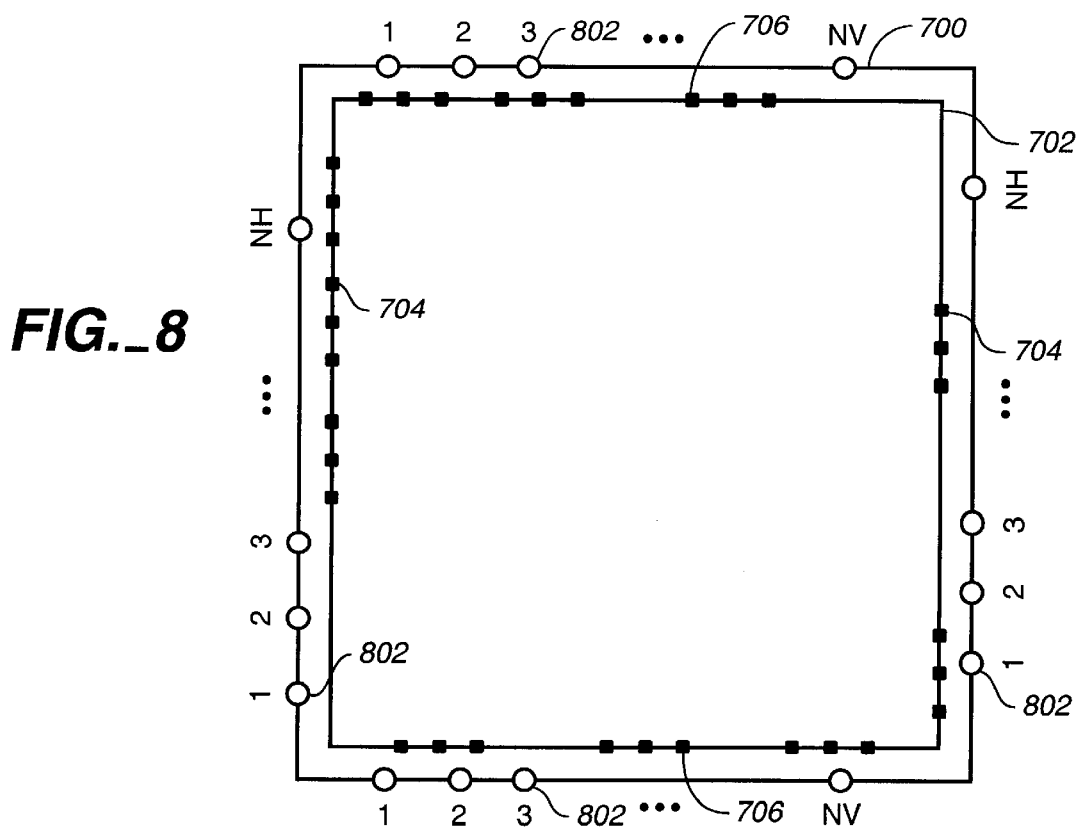
FIG._8

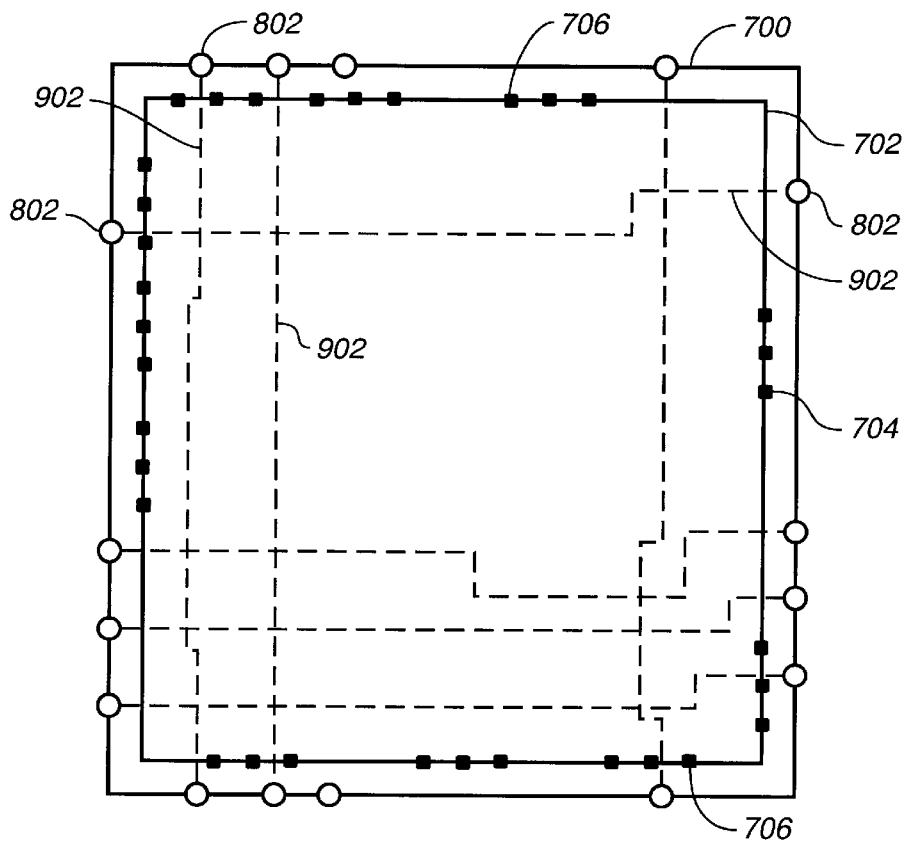
FIG._9
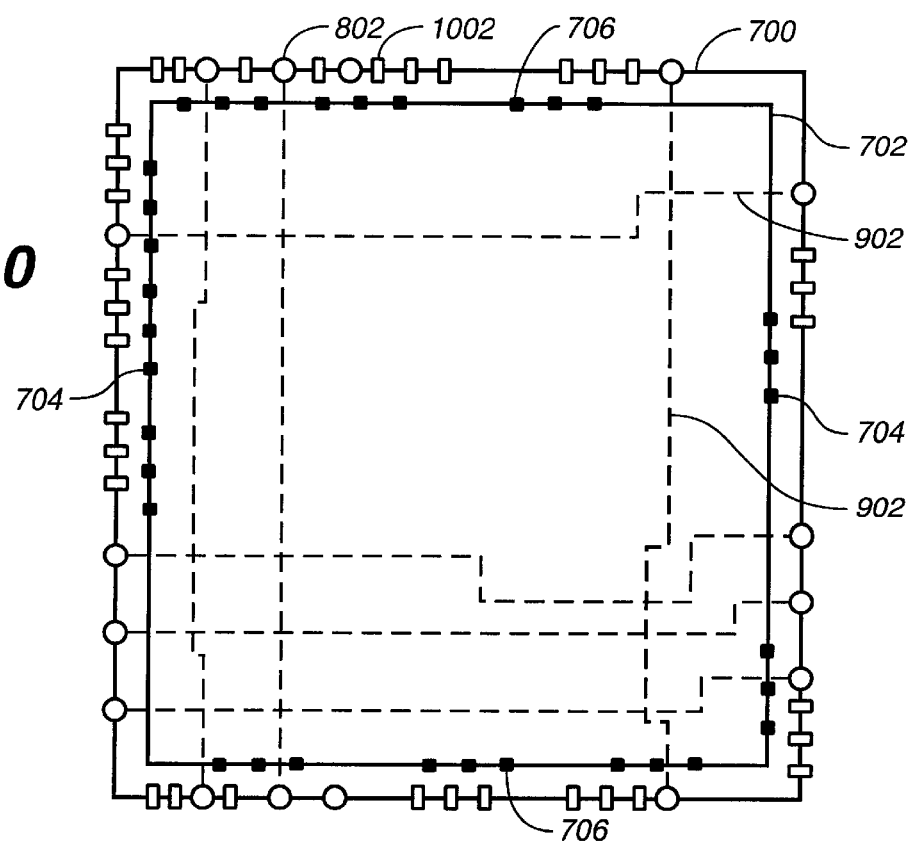
FIG._10

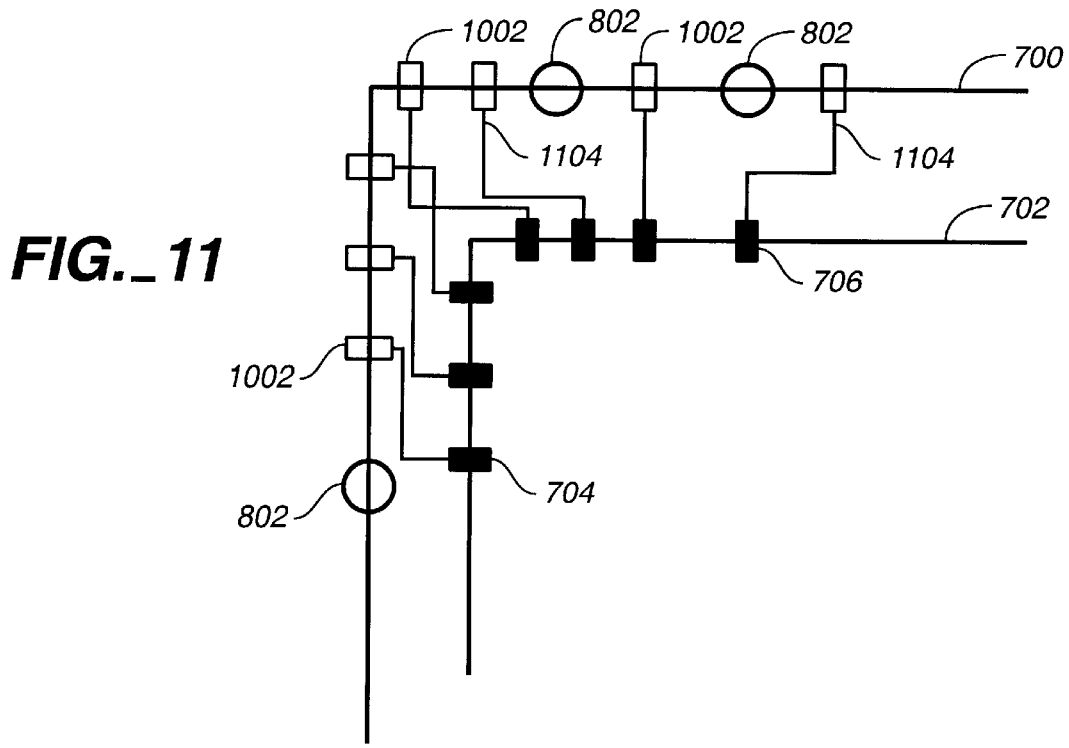
FIG._11
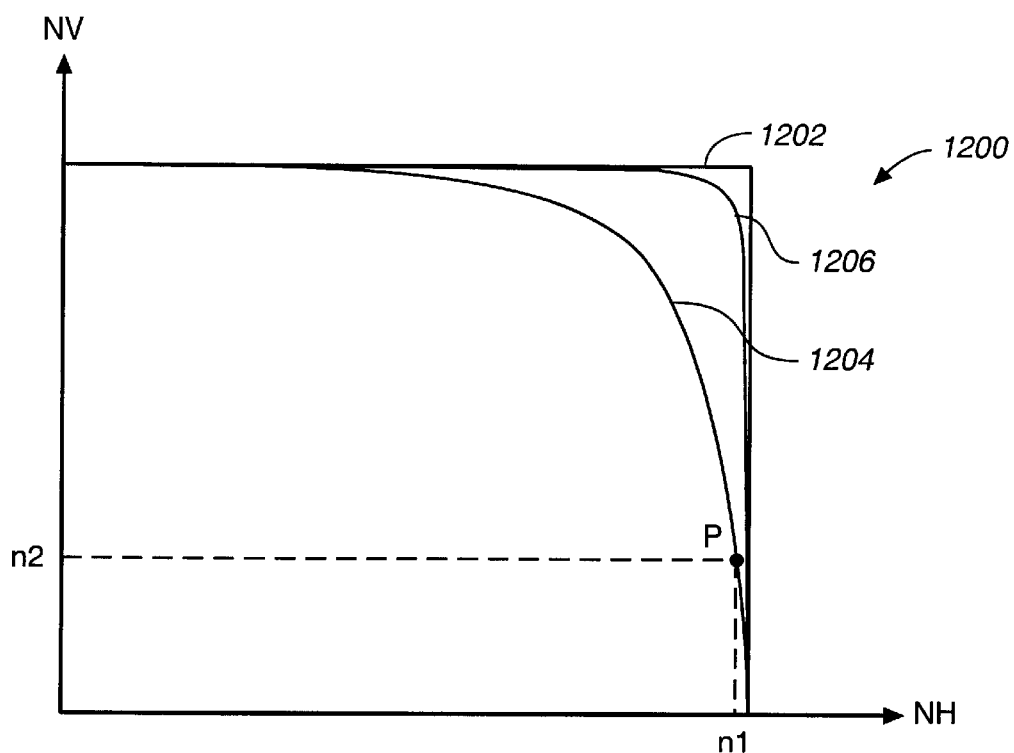
FIG._12

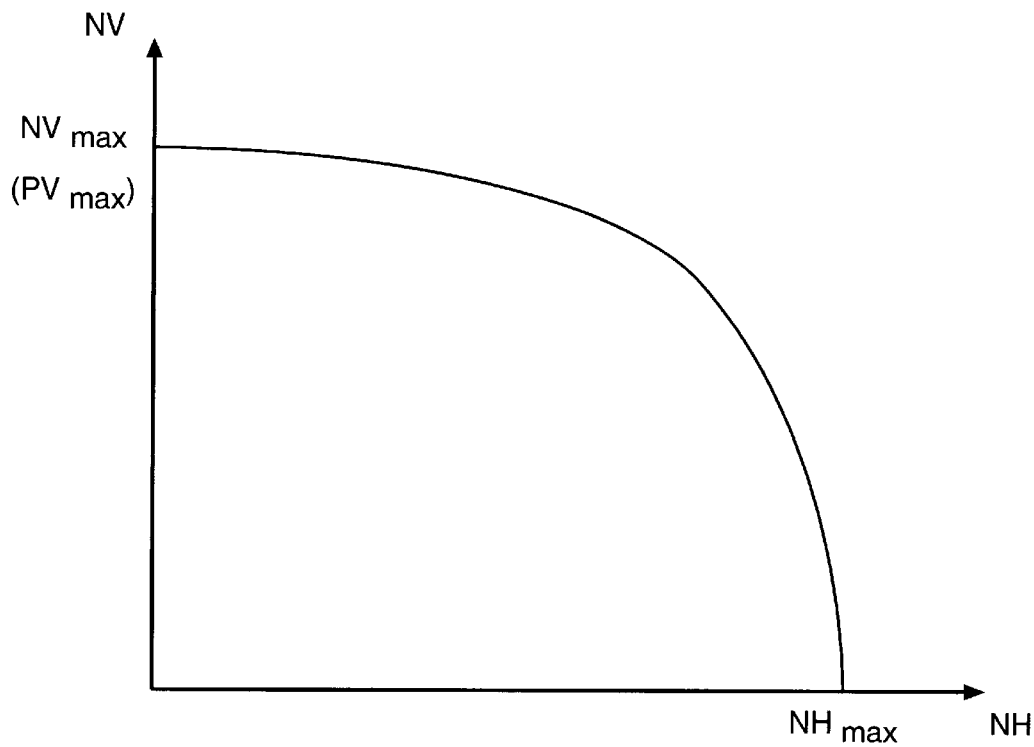
FIG._13C
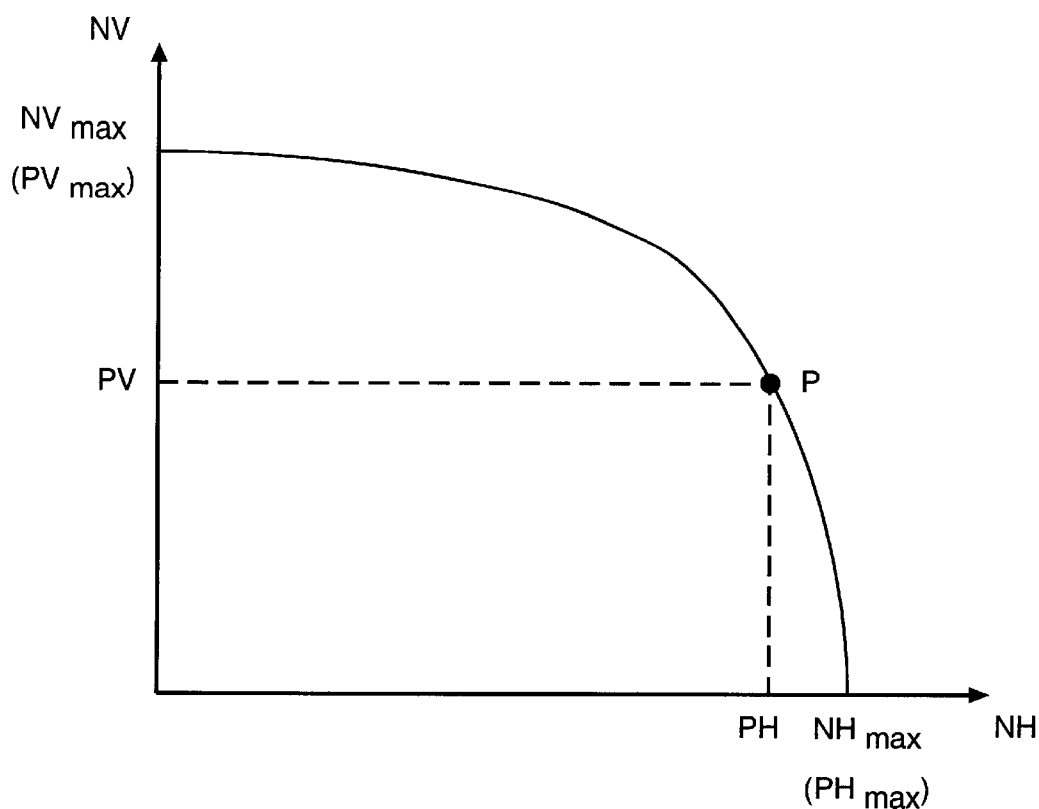
FIG._13D

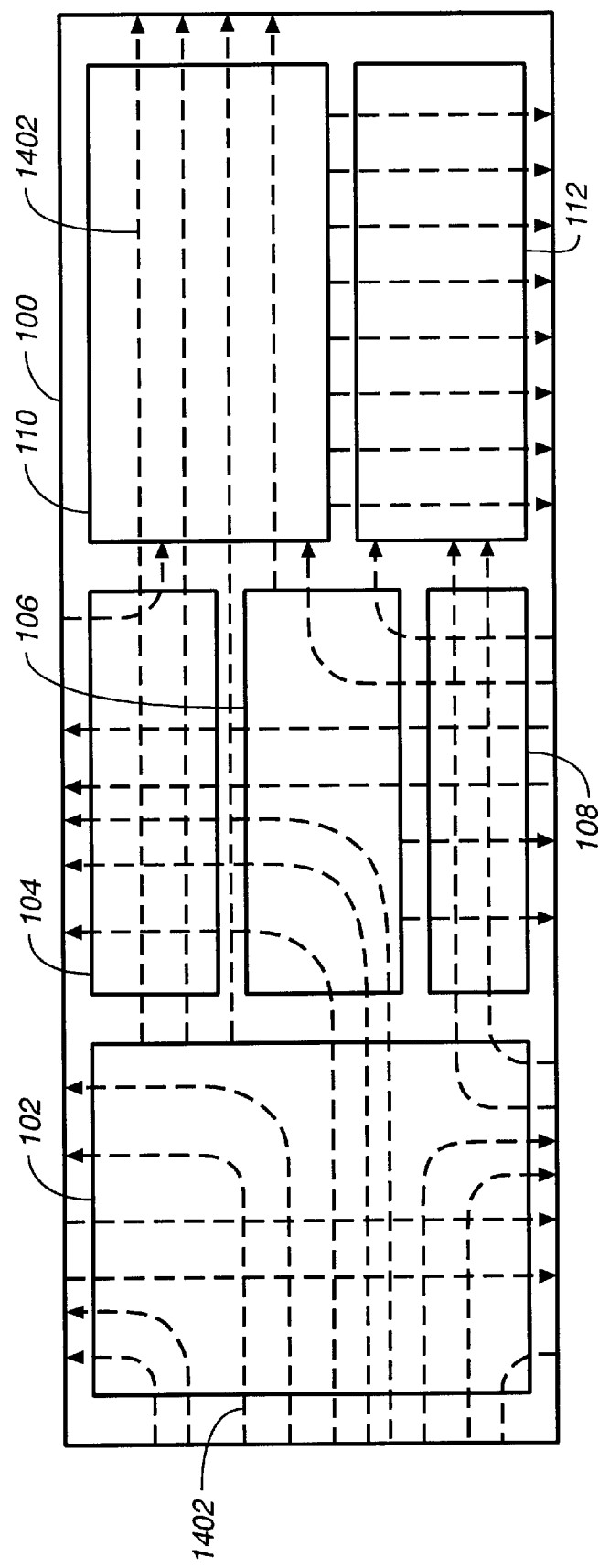
FIG._14

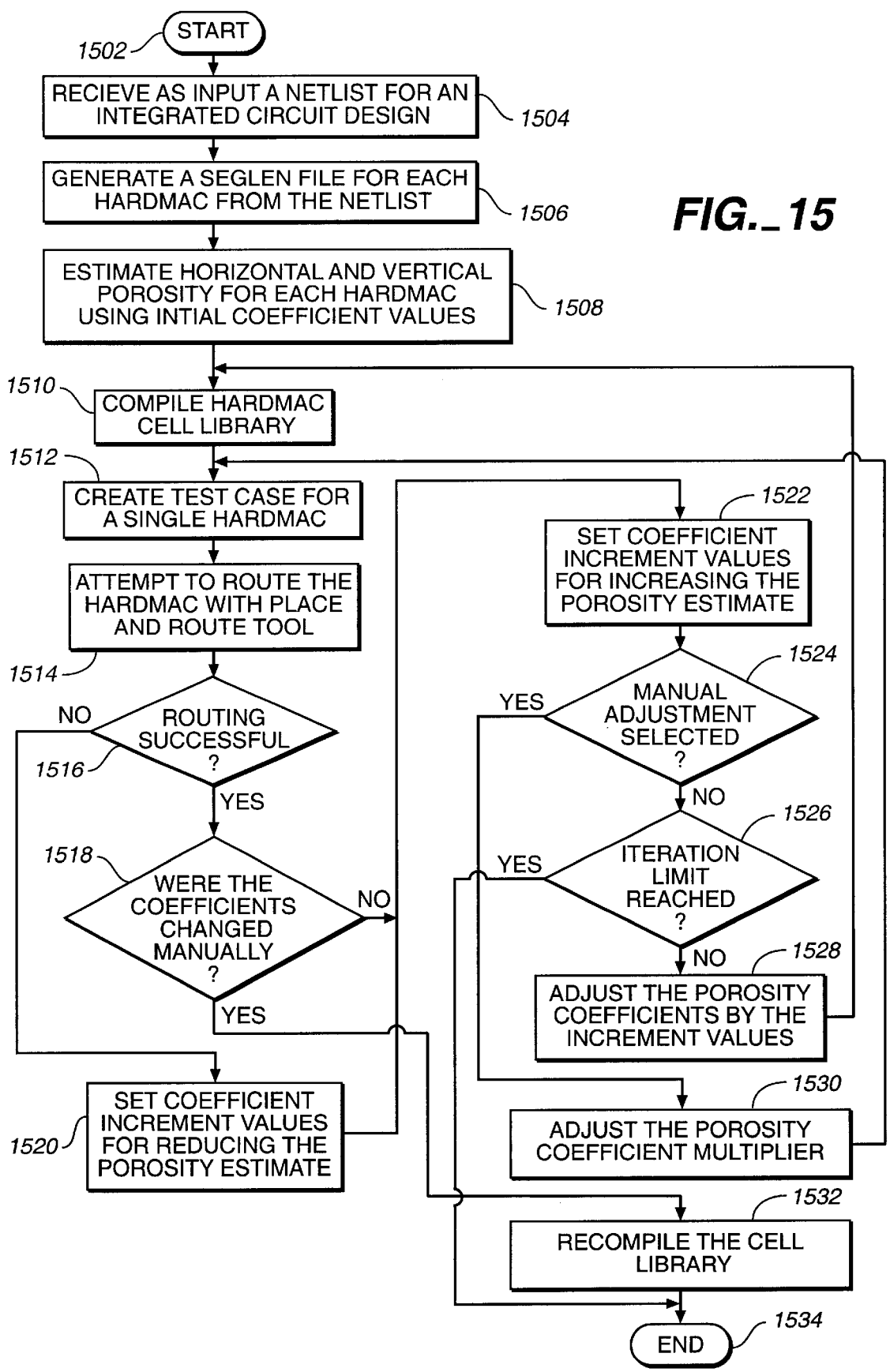
FIG._15

METHOD FOR ESTIMATING CELL POROSITY OF HARDMACS

CROSS-REFERENCE TO RELATED APPLICATIONS

This application claims priority under 35 USC § 119(e) to U.S. Provisional Patent Application Serial No. 60/250,482 of Alexander Tetelbaum et al. for SEGLEN METHOD OF ESTIMATING POROSITY OF TERA GATES, filed Nov. 30, 2000, incorporated herein by reference as if set forth in its entirety.

BACKGROUND OF THE INVENTION

The present invention relates generally to design tools for integrated circuits. More specifically, but without limitation thereto, the present invention relates to a method for estimating the number of transit connections that may be routed through a hard macro of an integrated circuit.

Integrated circuits typically include blocks or partitions of multiple circuit elements called hard macros or "hardmacs". Each hardmac is a generally rectangular cell that may be a complex hierarchical module containing several smaller modules. Connections made between hardmacs that pass through an intervening hardmac are called transit connections. The number of available transit connections, i.e., the total number of connections of a hardmac minus those connections used internally by the hardmac is termed the porosity of the hardmac. The absolute porosity is the number of transit connections that can be made through a hardmac in either the vertical or the horizontal direction. The relative porosity is the ratio of the absolute porosity to the maximum number of transit connections that can be made through an empty cell having the same size as the hardmac. The porosity of each hardmac in an integrated circuit chip design is useful information for logic design tools that design routable floorplans. Disadvantageously, porosity information is generally not available from hardmac cell libraries, and may be costly to generate.

SUMMARY OF THE INVENTION

The present invention advantageously addresses the problems above as well as other problems by providing a method of estimating the number of available transit connections, or porosity, of a hardmac.

In one embodiment, the present invention may be characterized as a method of estimating horizontal and vertical porosity of a hardmac that includes the steps of (a) calculating a total layer capacity of the hardmac; (b) calculating a number of available transit connections from the total layer capacity; (c) estimating a number of transit connections used for internal routing; (d) calculating an absolute porosity of the hardmac from the number of available transit connections and the number of transit connections used for internal routing; (e) calculating a relative porosity of the hardmac from the total metal layer capacity and the absolute porosity; and (f) generating as output the relative porosity of the hardmac as an estimated porosity.

In another embodiment, the present invention may be characterized as a method of estimating horizontal and vertical porosity of a hardmac that includes the steps of (a) calculating a total layer capacity of the hardmac; (b) calculating a number of available transit connections from the total layer capacity; (c) estimating a number of transit connections used for internal routing; (d) calculating an absolute porosity of the hardmac from the number of available transit connections and the number of transit connections used for internal routing; (e) calculating a relative porosity of the hardmac from the total metal layer capacity and the absolute porosity;(f) generating as output the relative porosity of the hardmac as an estimated porosity; and adjusting a coefficient to vary the estimated porosity generated as output in step (e) such that the estimated porosity has a maximum value for which the hardmac may be routed by a place and route tool.

In a further embodiment, the present invention may be characterized as a computer program product for estimating the porosity of a hardmac that includes a medium for embodying a computer program for input to a computer and a computer program embodied in the medium for causing the computer to perform the following functions: (a) calculating a total layer capacity of the hardmac; (b) calculating a number of available transit connections from the total layer capacity; (c) estimating a number of transit connections used for internal routing; (d) calculating an absolute porosity of the hardmac from the number of available transit connections and the number of transit connections used for internal routing; (e) calculating a relative porosity of the hardmac from the total metal layer capacity and the absolute porosity; and (f) generating as output the relative porosity of the hardmac as an estimated porosity.

BRIEF DESCRIPTION OF THE DRAWINGS

The present invention is illustrated by way of example and not limitation in the accompanying figures, in which like references indicate similar elements, and in which:

FIG. 1 is a diagram of a hardmac floorplan for estimating hardmac porosity according to an embodiment of the present invention;

FIG. 2 is a diagram of a hardmac of FIG. 1 illustrating internal connections and transit connections;

FIG. 3 is a diagram of a connection tree for the hardmac of FIG. 2;

FIG. 4 is a diagram of horizontal routing layers for the hardmac of FIG. 2;

FIG. 5 is a diagram of vertical routing layers for the hardmac of FIG. 2;

FIGS. 6A and 6B illustrate a flowchart of a method for estimating horizontal and vertical porosity according to an embodiment of the present invention;

FIG. 7 is a diagram of a single floorplan block for finding actual values of hardmac porosity to validate the method illustrated in the flowchart of FIG. 6;

FIG. 8 is a diagram of the floorplan block of FIG. 7 with the addition of paired block pins;

FIG. 9 is a diagram of the floorplan block of FIG. 8 with the addition of transit connections;

FIG. 10 is a diagram of the floorplan block of FIG. 9 with the addition of input and output pins;

FIG. 11 is a magnified view of the diagram of FIG. 10 illustrating the routing between the horizontal pins and the vertical pins and the input and output pins;

FIG. 12 is a graph illustrating examples of porosity curves for the floorplan block of FIG. 10;

FIGS. 13A, 13B, 13C, and 13D are graphs illustrating a method for plotting an actual porosity curve according to a method of the present invention;

FIG. 14 illustrates an example of horizontal and vertical transit connections for the hardmac floorplan of FIG. 1; and FIGS. 15A and 15B are a flowchart illustrating a method of adjusting the coefficients for the method of estimating hardmac porosity illustrated in the flowchart of FIG. 6.

Figure 13A:
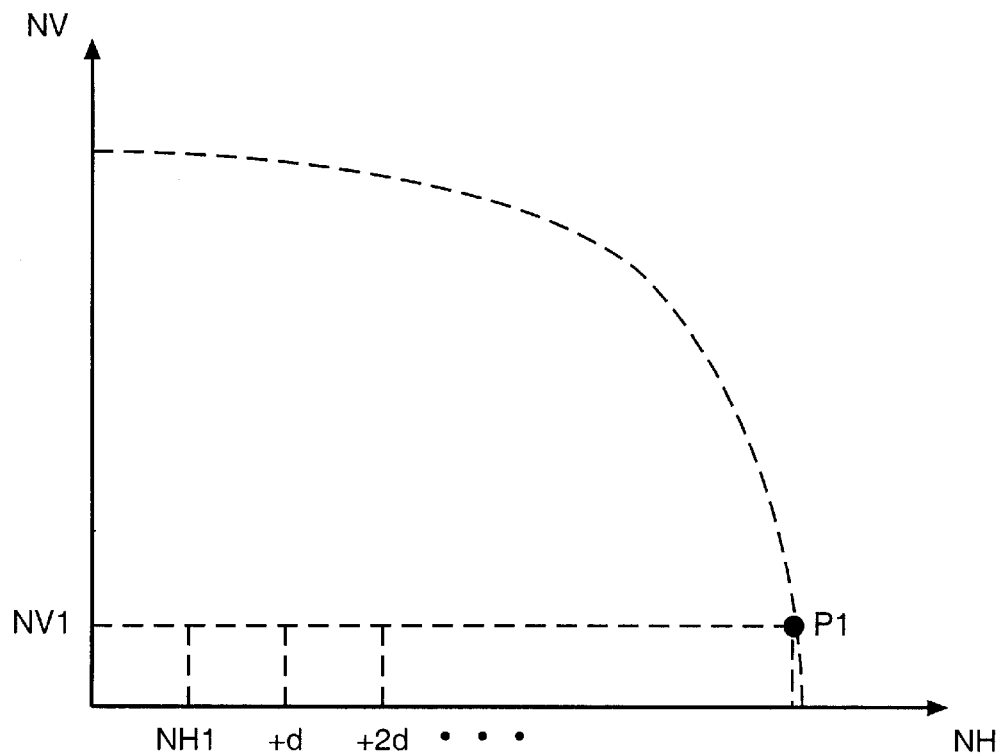

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE EMBODIMENTS

The following description is presented to disclose the currently known best mode for making and using the present invention. The scope of the invention is defined by the claims.

A logic design tool called a floorplanning tool is used to lay out an arrangement of circuit modules, or hardmacs, that are connected together to constitute an integrated circuit chip. Such an arrangement of hardmacs is illustrated in FIG. 1.

FIG. 1 is a diagram of a hardmac floorplan 100 for estimating hardmac porosity according to an embodiment of the present invention. Shown in FIG. 1 are hardmacs 102, 104, 106, 108, 110, and 112. Each of the hardmacs 102, 104, 106, 108, 110, and 112 may be a complex hierarchical module of smaller circuit modules. To produce a routable floorplan, a floorplanning tool should have the capability to predict the connection density of each of the hardmacs 102, 104, 106, 108, 110, and 112. Connections made between hardmacs that pass through an intervening hardmac are called transit connections. The number of available transit connections, i.e., the total number of connections of a hardmac minus those connections used internally by the hardmac is termed the porosity of the hardmac. The absolute porosity is the number of transit connections that can be made through a hardmac in either the vertical or the horizontal direction. The relative porosity is the ratio of the absolute porosity to the maximum number of transit connections that can be made through an empty cell having the same area and the same number of routing layers as the hardmac. The present invention is directed to a method of estimating the relative porosity for each hardmac in both the vertical and the horizontal routing directions.

FIG. 2 is a diagram illustrating internal connections and horizontal transit connections of the hardmac 104 in FIG. 1. Shown in FIG. 2 are the hardmac 104, cells 202, internal connections 204, and transit connections 206.

The hardmac 104 is a generally rectangular arrangement containing the cells 202. The cells 202 are connected to one another by the internal connections 204. In most hardmac designs, some space for making connections is left available and may be used for making the transit connections 206. The transit connections 206 cross the hardmac 104 for making connections between hardmacs on either side of the hardmac 104 that are not directly related to the internal connections 204 of the hardmac 104.

The number of available transit connections 206 of the hardmac 104 that are not used internally by the hardmac 104 is termed the porosity of the hardmac 104. The porosity of each hardmac in an integrated circuit chip design is useful information for logic design tools that design routable floorplans. However, manually analyzing each hardmac to calculate the number of available transit connections is too time-consuming for a practical product development cycle.

Existing logic design tools such as "lsimc" available from LSI Logic, Inc. in Milpitas, Calif. may be used to create a hardmac design and to generate a description of the design that includes a netlist and a netlist output called a seglen file in which each net of the hardmac is described as a set of connection segments and vias between metal layers. The set of connection segments and vias between metal layers may be illustrated as a connection tree for each net that connects the net with the hardmac pins.

FIG. 3 is a diagram of a connection tree 300 for a net of the hardmac 104 of FIG. 2. Shown in FIG. 3 are hardmac pins 302 (P1), 304 (P2), 306 (P3), 308 (P4), 310 (P5), and 312 (P6), vias 314 (V1), 316 (V2), 318 (V3), 320 (V4), and 322 (V5), vertical connections 324 (CV1), 326 (CV2), 328 (CV3), 330 (CV4), and 332 (CV5), and horizontal connections 334 (CH1), 336 (CH2), 338 (CH3), 340 (CH4), and 342 (CH5). In general, the vertical connections 324–332 and horizontal connections 334–342 of the connection tree 300 are the shortest possible connections that can connect the hardmac pins 302–312. The connection tree 300 is generated by a logic design routing tool in a netlist format according to well known techniques. The seglen file obtained from the netlist includes information about the coordinates of each hardmac pin so that values of the following factors may be calculated for the hardmac: the total number of pins ($N_{PIN}$); the total number of vias ($N_{VIA}$); the total number of nets ($N_{NET}$); the total number of horizontal and vertical connections ($N_C$); the total number of vertical connections ($N_{CV}$); the total number of horizontal connections ($N_{CH}$); the total length (in grids) of all internal connections from one pin to another ($L_C$); the total length (in grids) of vertical connections ($L_{CV}$); and the total length (in grids) of horizontal connections ($L_{CH}$). From these factors, the maximum number of transit connections that can be made through the hardmac in the horizontal direction may be estimated from the layer capacity as described below. A similar method may be used to estimate the maximum number of transit connections that can be made through the hardmac in the vertical direction, where the power rails inside the hardmac should also be taken into account.

The total horizontal layer capacity may be defined as the total number of all horizontal grids in all metal layers of the hardmac that can be used for routing transit connections in the horizontal direction and may be expressed by the following formula:

$$TLCH = M_H \cdot \frac{W'}{G_V} \cdot \frac{H'}{G_H} = M_H \cdot W \cdot H \tag{1}$$

where $G_H$ is the horizontal grid pitch, $G_V$ is the vertical grid pitch, W' is the hardmac width, and H' is the hardmac height. The hardmac width and height may be expressed in grids instead of units of length by W and H, respectively, where $W=W'/G_V$ and $H=H'/G_H$. $M_H$ is the total number of metal layers in the hardmac available for horizontal transit connection routing.

FIG. 4 is diagram of horizontal routing layers in the hardmac 104 of FIG. 2. Shown in FIG. 4 are horizontal routing layers 402 and 404, horizontal transit connections 206, horizontal grid pitch $G_H$, vertical grid pitch $G_V$, hardmac width W', and hardmac height H'.

The layer capacity in the horizontal direction available for transit connections may be expressed by the following formula:

$$LCH = TLCH - IRH \tag{2}$$

where LCH is the absolute horizontal porosity, and IRH is an estimate of the maximum number of internal connections in the horizontal direction given by the following formula:

$$IRH = K \cdot K_G \cdot L_{CH} \tag{3}$$

where K is an empirical coefficient that may be set equal to one or adjusted by trial and error and applied to every hardmac in the cell library, $K_G$ is a gate complexity coefficient that depends on the other factors derived from the connection tree described above with reference to FIG. 3, and $L_{CH}$ is the total length of all horizontal connections. The gate complexity coefficient $K_G$ may be expressed by the following formula:

$$K_G = 1 + \sum_{factor} W_{factor} \cdot Normalize(factor) \qquad (4)$$

where each factor is calculated from the seglen file, Normalize (factor) is a function that normalizes the value of each factor such that $0 \leq Normalize(factor) \leq 1$, $W_{factor}$ is an importance weight of the factor such that $0 \leq W_{factor} \leq 1$, and the sum of $W_{factor}$ for all factors is equal to one.

The dependence of the gate complexity coefficient $K_G$ on each of the factors is illustrated in Table 1 below:

TABLE 1

| No | Factor | $W_{factor}$ | Normalize(factor) |
|---|---|---|---|
| 1 | Total number of pins ($N_{PIN}$) | 0.35 | C $N_{PIN}$ |
| 2 | Total number of vias ($N_{VIA}$) | 0.35 | C $N_{VIA}$ |
| 3 | Total number of nets ($N_{NET}$) | 0.01 | 2 C $N_{NET}$ |
| 4 | Total number of connections ($N_C$) | 0.05 | 0.5 C $N_C$ |
| 5 | Total number of vertical connections ($N_{CV}$) | 0.04 | 0.5 C $N_{CV}$ |
| 6 | Total number of horizontal connections ($N_{CH}$) | 0.05 | 0.5 C $N_{CH}$ |
| 7 | Total length of all connections ($L_C$) | 0.05 | $L_C/A$ ($M_H + M_V$) |
| 8 | Length of vertical connections ($L_{CV}$) | 0.1 | $L_{CV}/A\, M_V$ |
| 9 | Length of horizontal connections ($L_{CH}$) | N/A* | |

*present in IRH formula

The normalization coefficient C may be given by, for example, by the following formula:

$$C = \frac{1}{p\sqrt{N_{cell} \cdot A}} = \frac{1}{p\sqrt{N_{cell} \cdot W \cdot H}} \qquad (5)$$

where A is the area of the hardmac, $N_{CELL}$ is the number of cells in the hardmac, and p is a cell complexity coefficient that ranges from about 0.25 for average cells to about 0.5 for cells with a maximum number of pins.

Once LCH is calculated from (2), the number of possible transit connections through the hardmac 104 in the horizontal direction, or absolute horizontal porosity, may be found from the following formula:

$$PH = \frac{K \cdot LCH}{W} = K \cdot \left(M_H \cdot H - \frac{IRH}{W}\right) \qquad (6)$$

where $W='/G_V$ and $H=H'/G_H$ to express the hardmac width and height in grids instead of units of length.

The relative horizontal porosity is then given by the following formula:

$$PRH = \frac{PH \cdot W \cdot 100\%}{TLCH} \qquad (7)$$

FIG. 5 is diagram of vertical routing layers for the hardmac 104 of FIG. 2. Shown in FIG. 5 are vertical routing layers 502, 504, and 506, vertical transit connections 508, horizontal grid pitch $G_H$, vertical grid pitch $G_V$, hardmac width W', and hardmac height H'.

The total layer capacity in the vertical direction TLCV may be defined as the total number of all vertical grids in all metal layers of the hardmac that can be used for routing in the vertical direction and may be expressed by the following formula:

$$TLCV = M_V \cdot \frac{W' - 2 \cdot N_{PC} \cdot W_P}{G_V} \cdot \frac{H'}{G_H} = M_V \cdot W \cdot H \qquad (8)$$

where $M_V$ is the total number of metal layers available in the hardmac for vertical transit connection routing, $N_{PC}$ is the number of placement columns (vertical areas on the hardmac where cells may be placed), and $W_P$ is the width of a power rail inside the hardmac. The dependence of the gate complexity coefficient $K_G$ on each of the factors is illustrated in Table 2 below:

TABLE 2

| No | Factor | $W_{factor}$ | Normalize(factor) |
|---|---|---|---|
| 1 | Total number of pins ($N_{PIN}$) | 0.35 | C $N_{PIN}$ |
| 2 | Total number of vias ($N_{VIA}$) | 0.35 | C $N_{VIA}$ |
| 3 | Total number of nets ($N_{NET}$) | 0.01 | 2 C $N_{NET}$ |
| 4 | Total number of connections ($N_C$) | 0.05 | 0.5 C $N_C$ |
| 5 | Total number of vertical connections ($N_{CV}$) | 0.04 | 0.5 C $N_{CV}$ |
| 6 | Total number of horizontal connections ($N_{CH}$) | 0.05 | 0.5 C $N_{CH}$ |
| 7 | Total length of all connections ($L_C$) | 0.05 | $L_C/A$ ($M_H + M_V$) |
| 8 | Length of vertical connections ($L_{CV}$) | N/A* | $L_{CH}/A\, M_H$ |
| 9 | Length of horizontal connections ($L_{CH}$) | 0.1 | |

*present in IRV formula

The layer capacity in the vertical direction may be expressed by the following formula:

$$LCV = TLCV - IRV \qquad (9)$$

where LCV is the absolute vertical porosity and IRV is an estimate of the maximum number of internal connections in the vertical direction. For example, IRV may be estimated from the following formula:

$$IRV = K \cdot K_G \cdot L_{CV} \qquad (10)$$

where K and $K_G$ are the same as in formula (3), and $L_{CV}$ is the total length of all vertical connections.

Once LCV is known, then the number of possible transit connections through the hardmac in the vertical direction, or absolute vertical porosity, may be calculated by the following formula:

$$PV = \frac{K \cdot LCV}{H} = K \cdot \left(M_V \cdot W - \frac{IRV}{H}\right) \qquad (11)$$

where $W=W'/G_V$ and $H=H'/G_H$.

The relative vertical porosity may be calculated by the following formula:

$$PRV = \frac{PV \cdot H \cdot 100\%}{TLCV} \quad (12)$$

The estimation of the porosity of all the hardmacs 102, 104, 106, 108, 110, and 112 in FIG. 1 may be included in the cell characteristics for the hardmac in a cell library and used during hardmac floorplanning to achieve reduction in hardmac area and higher hardmac routability.

The empirical coefficient K used in formulas (3), (6), (10), and (11) may be found, for example, by applying the method described above to several hardmac designs and finding a value for K that results in the lowest average error. The resulting value of K may then be substituted into formulas (3), (6), (10), and (11). The average error of the relative porosity estimated by this method has been found to be about nine percent. The method described above may be summarized in a flowchart as follows.

FIGS. 6A and 6B illustrate a flowchart 600 of a method for estimating horizontal and vertical porosity according to an embodiment of the present invention.

Step 602 is the entry point for the flowchart 800.

In step 604, a seglen file output of a netlist for a cell library is received as input;

In step 606, the total horizontal layer capacity of a hardmac in the cell library is calculated from the following formula:

$$TLCH = M_H \cdot \frac{W'}{G_V} \cdot \frac{H'}{G_H} = M_H \cdot W \cdot H$$

where $G_H$ is the horizontal grid pitch, $G_V$ is the vertical grid pitch, W' is the hardmac width, H' is the hardmac height, $W=W'/G_V$, $H=H'/G_H$, and $M_H$ is the total number of metal layers in the hardmac available for horizontal transit connection routing.

In step 608, the maximum number of internal connections in the horizontal direction is estimated from the following formula:

$IRH = K \cdot K_G \cdot L_{CH}$ where K is an empirical coefficient that may be set equal to one or adjusted by trial and error and applied to every hardmac in the cell library, $K_G$ is a gate complexity coefficient, and $L_{CH}$ is the total length of all horizontal connections.

In step 610, the available horizontal layer capacity is calculated from the following formula:

$LCH = TLCH - IRH$ where LCH is the number of available horizontal grids.

In step 612, the absolute horizontal porosity is calculated from the following formula:

$$PH = \frac{K \cdot LCH}{W} = K \cdot \left( M_H \cdot H - \frac{IRH}{W} \right)$$

In step 614, the relative horizontal porosity is calculated from the following formula:

$$PRH = \frac{PH \cdot W \cdot 100\%}{TLCH}$$

In step 616, the total vertical layer capacity of the hardmac is calculated from the following formula:

$$TLCV = M_V \cdot \frac{W' - 2 \cdot N_{PC} \cdot W_P}{G_V} \cdot \frac{H'}{G_H} = M_V \cdot W \cdot H$$

where $M_V$ is the total number of metal layers available in the hardmac for routing transit connections in the vertical direction, $N_{PC}$ is the number of placement columns, and $W_P$ is the width of a power rail inside the hardmac.

In step 618, the maximum number of internal connections in the vertical direction is estimated from the following formula:

$IRV = K \cdot K_G \cdot L_{CV}$ where K is an empirical coefficient that may be set equal to one or adjusted by trial and error and applied to every hardmac in the cell library, $K_G$ is a gate complexity coefficient, and $L_{CV}$ is the total length of all vertical connections.

In step 620, the available vertical layer capacity is calculated from the following formula:

$LCV = TLCV - IRV$ where LCV is the number of available vertical grids.

In step 622, the absolute vertical porosity is calculated from the following formula:

$$PV = \frac{K \cdot LCV}{H} = K \cdot \left( M_V \cdot W - \frac{IRV}{H} \right)$$

In step 624, the relative vertical porosity is calculated from the following formula:

$$PRV = \frac{PV \cdot H \cdot 100\%}{TLCV}$$

In step 626, the estimated porosity values PRH and PRV are generated as output.

Step 628 is the exit point for the flowchart 600.

The flowchart 600 above for estimating the porosity of a hardmac may be embodied in a computer program product and implemented by a computer according to well known programming techniques to perform the following functions: (a) calculating a total layer capacity of the hardmac; (b) calculating a number of available transit connections from the total layer capacity; (c) estimating a number of transit connections used for internal routing; (d) calculating an absolute porosity of the hardmac from the number of available transit connections and the number of transit connections used for internal routing; and (e) calculating a relative porosity of the hardmac from the total metal layer capacity and the absolute porosity.

The empirical constants used in the method of estimating hardmac porosity described above and illustrated in Table 1 and Table 2 may be adjusted to reduce estimation error by comparing the estimated hardmac porosity values with the actual porosity values calculated by a commercially available place and route tool, for example, Avant!.

FIG. 7 is a diagram of a single floorplan block 700 for finding actual values of hardmac porosity to validate the method illustrated in the flowchart 600 of FIG. 6. Shown in FIG. 7 are a hardmac 702, horizontal pins 704, and vertical pins 706.

The floorplan block 700 contains the hardmac 702. The horizontal pins 704 are located on the left and right sides of the hardmac 702, and the vertical pins 706 are located on the top and bottom sides of the hardmac 702.

According to the porosity metrics of the hardmac 702, paired block pins are created on the floorplan block 700 on the left and right sides as well as on the top and bottom sides for later connection by the place and routing tool.

FIG. 8 is a diagram of the floorplan block 700 of FIG. 7 with the addition of paired block pins. Shown in FIG. 8 are a hardmac 702, horizontal pins 704, vertical pins 706, and paired block pins 802.

The number of paired block pins 802 for routing transit connections in the horizontal direction may be expressed by the following formula:

$$NH = NTH \cdot PH \qquad (13)$$

where NH is the number of paired block pins 802 for routing transit connections in the horizontal direction, NTH is the total number of possible paired block pins 802 on the left and right sides of the floorplan block 700, and PH is the relative horizontal porosity of the hardmac 702.

The number of paired block pins 802 for routing transit connections in the vertical direction may be expressed by the following formula:

$$NV = NTV \cdot PV \qquad (14)$$

where NV is the number of paired block pins 802 for routing transit connections in the vertical direction, NTV is the total number of possible paired block pins 802 on the top and bottom sides of the block 700, and PV is the relative vertical porosity of the hardmac 702. Once the paired block pins 802 are created for the floorplan block 700, the place and route tool can route wires between the paired block pins 802 as shown in FIG. 9.

FIG. 9 is a diagram of the floorplan block 700 of FIG. 8 with the addition of transit connections 902. Shown in FIG. 9 are a hardmac 702, horizontal pins 704, vertical pins 706, paired block pins 802, and transit connections 902.

The transit connections 902 are routed between the paired block pins 802 across the hardmac 702 between the horizontal pins 704 and the vertical pins 706.

FIG. 10 is a diagram of the floorplan block 700 of FIG. 9 with the addition of input and output pins 1002. Shown in FIG. 10 are a hardmac 702, horizontal pins 704, vertical pins 706, paired block pins 802, transit connections 902, and input and output pins 1002.

The input and output pins 1002 are created by the place and route tool slightly offset from the horizontal pins 704 and the vertical pins 706 to force realistic routing jogs as shown that would occur in an actual hardmac design.

FIG. 11 is a magnified view of the diagram of FIG. 10 illustrating the routing between the horizontal pins 704 and the vertical pins 706 and the input and output pins 1002. Shown in FIG. 11 are a hardmac 702, horizontal pins 704, vertical pins 706, paired block pins 802, input and output pins 1002, and pin connections 1104.

The place and route tool is then assigned the task of routing the floorplan block 700 with the pin arrangement described above. If the routing is completed successfully, the number of paired block pins 802 may be increased in the horizontal direction and in the vertical direction until a point is reached where the routing can no longer be completed. The actual relative horizontal porosity of the hardmac 702 may then be calculated by the following formula:

$$PH_{ACTUAL} = \frac{NH}{NH_{TOTAL}} \qquad (15)$$

where $NH_{TOTAL}$ is the total number of horizontal grids of the hardmac 702. Similarly, the actual relative vertical porosity of the hardmac 702 may be calculated by the following formula:

$$PV_{ACTUAL} = \frac{NV}{NV_{TOTAL}} \qquad (16)$$

where $NV_{TOTAL}$ is the total number of vertical grids of the hardmac 702.

The estimated porosity values may then be compared to the actual porosity values to evaluate and improve the accuracy of the estimation method as described above.

As the number of paired block pins 802 on the left and right sides of the hardmac 702 is increased, the place and route tool will start using vertical wires to jog the routes around each other, resulting in a decrease in the actual relative vertical porosity. Similarly, as the number of paired block pins 802 on the top and bottom sides of the hardmac 702 is increased, the place and route tool will start using horizontal wires to jog the routes around each other, resulting in a decrease in the actual relative vertical porosity. Expressed another way, the relative horizontal porosity and the relative vertical porosity are dependent on each other.

FIG. 12 is a graph 1200 illustrating examples of porosity curves for the floorplan block 700 of FIG. 10. Shown in FIG. 12 are an ideal porosity curve 1202 and actual porosity curves 1204 and 1206. The ideal porosity curve 1202 corresponds to the case where the relative vertical porosity and the relative horizontal porosity are independent of each other. The actual porosity curves 1204 and 1206 show that as the number of horizontal transit connections is increased, the vertical porosity given by point P on the porosity curve decreases. Similarly, as the number of vertical transit connections is increased, the horizontal porosity decreases. The shape of the actual porosity curve depends on the place and route tool used.

Figure 13B:
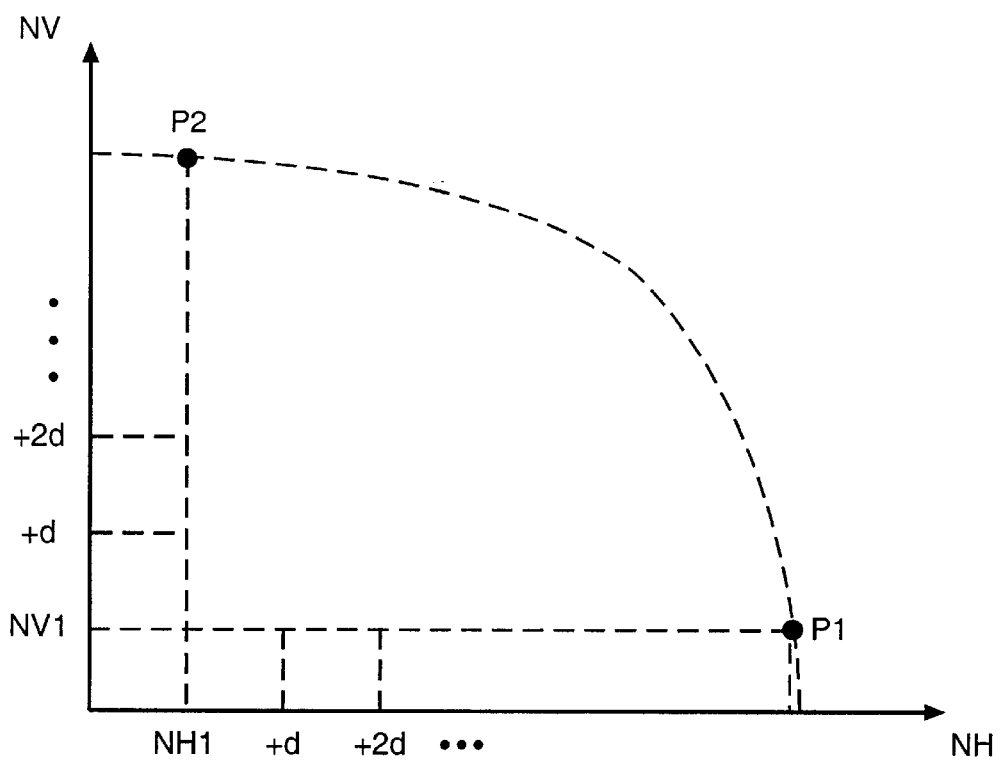

FIGS. 13A, 13B, 13C, and 13D are graphs illustrating a method for plotting an actual porosity curve according to a method of the present invention. Small initial values NV1 and NH1 are selected for the number of paired block pins 708 in the vertical direction and the horizontal direction, respectively. The corresponding number of paired block pins 802 are created accordingly by the place and route tool for the block 700 as discussed above with reference to FIG. 8. If the floorplan block 700 can be routed successfully, then NH1 is incremented by a number (+d) and the routing is attempted again. Each time the routing is successful, NH1 is incremented until the routing cannot be completed. The coordinates given by NH1 and NV1 are used to plot point P1 in FIG. 13A.

The number of horizontal paired block pins 802 is then reset to NH1, and NV1 is incremented in the same manner as was performed with NH1 until the routing cannot be completed. The coordinates given by NH1 and NV1 are used to plot point P2 in FIG. 13B. The intermediate points may be found by repeating the same process for each incremented value of NH1 and NV1 to define the curve shown in FIG. 13C.

The point P where both the horizontal porosity PH and the vertical porosity PV are as large as possible may be found by maximizing a function F that combines the dependencies of PH and PV as plotted in the graph of FIG. 13D. The function F may be expressed by the following formula:

$$F = PH(NV) + PV(NH) \qquad (17)$$

In an actual design, the horizontal porosity may be more important in some hardmac designs than the vertical porosity, or vice versa.

FIG. 14 illustrates an example of horizontal and vertical transit connections 1402 for the hardmac floorplan 100 of FIG. 1. Shown in FIG. 14 are a hardmac floorplan 100, hardmacs 102, 104, 106, 108, 110, and 112, and transit connections 1402. As illustrated in FIG. 14, the transit connections 1402 across the hardmac 110 are all horizontal, the transit connections 1402 across the hardmac 112 are all vertical, and the transit connections 1402 across the hardmacs 102, 104, 106, and 108 are routed with combination of vertical and horizontal transit connections 1402. To recognize the difference in importance between vertical and horizontal transit connections 1402, depending on floorplanning requirements such as datapath placement, a horizontal weight $W_H$ and a vertical weight $W_V$ may be incorporated into (17) to give the following formula for F:

$$F = W_H PH(NV) + W_V PV(NH) \qquad (18)$$

Point P and the final values for the horizontal porosity PH and the vertical porosity PV may then be found according to well known techniques by finding the values of NV and NH that result in a maximum value of F. The porosity estimation coefficients used in the method described above with reference to the flowchart of FIG. 6 may then be adjusted so that the estimated porosity values match the actual porosity values.

FIGS. 15A and 15B are a flowchart 1500 illustrating a method of adjusting the coefficients for the method of estimating hardmac porosity illustrated in the flowchart 600 of FIG. 6.

Step 1502 is the entry point for the flowchart 1400.

In step 1504, a netlist for an integrated circuit design is received as input.

In step 1506, a seglen file is generated for each hardmac in the netlist.

In step 1508, horizontal and vertical porosity values are estimated using an initial set of hardmac porosity estimation coefficients. The hardmac porosity estimation coefficients may be those used in the method illustrated in the flowchart 600 of FIG. 6, or they may be the coefficients of any other suitable method for estimating hardmac porosity.

In step 1510, a hardmac cell library is compiled that includes the estimated horizontal and vertical porosity values.

In step 1512, a test case is created using a single hardmac as described above with reference to FIG. 7 from the hardmac cell library.

In step 1514, routing of the hardmac is attempted by a place and route tool according to well known techniques.

In step 1516, if the routing is successful, then the estimated hardmac porosity values are on the pessimistic side, and processing continues at step 1518. Otherwise, the estimated hardmac porosity values are on the optimistic side, and processing continues at step 1520.

In step 1518, if the hardmac porosity estimation coefficients were adjusted by a manually selected multiplier, then processing continues at step 1532. Otherwise, automatic incrementation is used to find the maximum values for the estimated porosity, and processing continues at step 1522.

In step 1520, hardmac porosity estimation coefficient increment values are set to reduce the values of the estimated hardmac porosity, and processing continues at step 1524.

In step 1522, hardmac porosity estimation coefficient increment values are set to increase the values of the estimated hardmac porosity.

In step 1524, if the hardmac porosity estimation coefficients are to be adjusted by a manually selected multiplier, then processing continues at step 1530.

In step 1526, if an iteration limit is reached for automatic incrementation to find the maximum values for the estimated porosity, then processing continues at step 1534. The iteration limit avoids looping endlessly between increasing and decreasing the porosity estimates.

In step 1528, the hardmac porosity estimation coefficients are adjusted by the increment values and the estimates of the porosity values are recalculated as described above with reference to the flowchart of FIG. 6. To save computer resources involved in recompiling the hardmac library, engineering judgment may be used to select values for the hardmac porosity estimation coefficients rather than incrementing the values automatically. Processing then continues at step 1510.

In step 1530, the hardmac porosity estimation coefficients are multiplied by the manually selected multiplier, and processing continues from step 1512.

In step 1532, the hardmac cell library is recompiled with the new estimated porosity values.

Step 1534 is the exit point for the flowchart 1500.

The estimation of hardmac porosity described above may be used to characterize a cell library so that the hardmac porosity is accounted for during floorplanning, advantageously resulting in the reduction of hardmac size and greater hardmac routability.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of estimating porosity of a hardmac comprising steps of:

(a) calculating a total layer capacity of the hardmac from a description of the hardmac design;

(b) calculating a number of available transit connections from the total layer capacity;

(c) calculating an absolute porosity of the hardmac from the number of available transit connections and the number of transit connections used for internal routing; and (d) calculating a relative porosity of the hardmac from the total metal layer capacity and the absolute porosity.

2. A method of estimating porosity of a hardmac comprising steps of:

(a) calculating a total layer capacity of the hardmac from a description of the hardmac design;

(b) calculating a number of available transit connections from the total layer capacity;

(c) calculating an absolute porosity of the hardmac from the number of available transit connections and the number of transit connections used for internal routing; and (d) calculating a relative porosity of the hardmac from the total metal layer capacity and the absolute porosity wherein step (a) includes calculating the total layer capacity substantially from the following formula:

$$TLCH = M_H \cdot \frac{W'}{G_V} \cdot \frac{H'}{G_H} = M_H \cdot W \cdot H$$

where TLCH is the total layer capacity in a horizontal direction, $G_H$ is the horizontal grid pitch, $G_V$ is the vertical grid pitch, W' is the hardmac width, H' is the hardmac height, $W=W'/G_V$, $H=H'/G_H$, and $M_H$ is the total number of metal layers in the hardmac available for horizontal transit connection routing.

3. The method of claim 2 wherein step (b) includes calculating the number of available grids substantially from the following formula:

$$LCH = TLCH - IRH$$

where LCH is the number of available grids in the horizontal direction and IRH is an estimate of the maximum number of internal connections in the horizontal direction.

4. The method of claim 3 wherein step (c) includes calculating an absolute porosity in the horizontal direction substantially from the following formula:

$$PH = \frac{K \cdot LCH}{W} = K \cdot \left( M_H \cdot H - \frac{IRH}{W} \right)$$

where K is an empirical coefficient.

5. The method of claim 4 wherein step (d) includes calculating a relative porosity in the horizontal direction substantially from the following formula:

$$PRH = \frac{PH \cdot W \cdot 100\%}{TLCH}$$

6. A method of estimating porosity of a hardmac comprising the steps of:
  (a) calculating a total layer capacity of the hardmac from a description of the hardmac design;
  (b) calculating a number of available transit connections from the total layer capacity;
  (c) calculating an absolute porosity of the hardmac from the number of available transit connections and the number of transit connections used for internal routing; and
  (d) calculating a relative porosity of the hardmac from the total metal layer capacity and the absolute porosity wherein step (a) includes calculating the total layer capacity substantially from the following formula:

$$TLCV = M_V \cdot \frac{W' - 2 \cdot N_{PC} \cdot W_P}{G_V} \cdot \frac{H'}{G_H} = M_V \cdot W \cdot H$$

where $M_V$ is the total number of metal layers available in the hardmac for vertical transit connection routing, $N_{PC}$ is the number of placement columns, and $W_P$ is the width of a power rail inside the hardmac.

7. The method of claim 3 wherein step (b) includes calculating the number of available grids substantially from the following formula:

$$LCV = TLCV - IRV$$

where LCV is the number of available grids in a vertical direction and IRV is an estimate of the maximum number of internal connections in the vertical direction.

8. The method of claim 7 wherein step (c) includes calculating an absolute porosity in the vertical direction substantially from the following formula:

$$PV = \frac{K \cdot LCV}{H} = K \cdot \left( M_V \cdot W - \frac{IRV}{H} \right).$$

9. The method of claim 8 wherein step (d) includes calculating a relative porosity in the vertical direction substantially from the following formula:

$$PRV = \frac{PV \cdot H \cdot 100\%}{TLCV}.$$

10. A method of estimating porosity of a hardmac comprising the steps of:
  (a) calculating a total layer capacity of the hardmac from a description of the hardmac design;
  (b) calculating a number of available transit connections from the total layer capacity;
  (c) calculating an absolute porosity of the hardmac from the number of available transit connections and the number of transit connections used for internal routing; and
  (d) calculating a relative porosity of the hardmac from the total metal layer capacity and the absolute porosity wherein step (b) includes the step of estimating the number of transit connections used for internal routing substantially from the following formula:

$$IRH = K \cdot K_G \cdot L_{CH}$$

where IRH is the number of transit connections used for internal routing in a horizontal direction, K is an empirical constant, $K_G$ is a gate complexity coefficient, and $L_{CH}$ is the total length of all horizontal connections.

11. The method of claim 10 wherein the gate complexity coefficient $K_G$ is calculated substantially from the following formula:

$$K_G = 1 + \sum_{factor} W_{factor} \cdot Normalize(factor)$$

where each factor is calculated from a seglen file, Normalize (factor) is a function that normalizes the value of each factor such that $0 \leq Normalize(factor) \leq 1$, $W_{factor}$ is an importance weight of each factor such that $0 \leq W_{factor} \leq 1$, and the sum of $W_{factor}$ for all factors is equal to one.

12. A method of estimating porosity of a hardmac comprising the steps of:
  (a) calculating a total layer capacity of the hardmac from a description of the hardmac design;
  (b) calculating a number of available transit connections from the total layer capacity;
  (c) calculating an absolute porosity of the hardmac from the number of available transit connections and the number of transit connections used for internal routing; and
  (d) calculating a relative porosity of the hardmac from the total metal layer capacity and the absolute porosity wherein step (b) includes estimating a number of transit connections used for internal routing substantially from the following formula:

$$IRV = K \cdot K_G \cdot L_{CV}$$

where IRV is the number of transit connections used for internal routing in a vertical direction, K is an empirical constant, $K_G$ is a gate complexity coefficient, and $L_{CV}$ is the total length of all vertical connections.

13. The method of claim 12 wherein the gate complexity coefficient $K_G$ is calculated substantially from the following formula:

$$K_G = 1 + \sum_{factor} W_{factor} \cdot Normalize(factor)$$

where each factor is calculated from a seglen file, Normalize (factor) is a function that normalizes the value of each factor such that $0 \leq Normalize(factor) \leq 1$, $W_{factor}$ is an importance weight of each factor such that $0 \leq W_{factor} \leq 1$, and the sum of $W_{factor}$ for all factors is equal to one.

14. The method of claim 1 further comprising the step of adjusting a coefficient to vary calculated values of the relative porosity such that the relative porosity has a maximum value for which the hardmac may be routed by a place and route tool.

15. The method of claim 1 further comprising the step of characterizing the hardmac in a cell library by the relative porosity.

16. A computer program product for estimating porosity of a hardmac comprising:
   a medium for embodying a computer program for input to a computer; and
   a computer program embodied in the medium for causing the computer to perform the following functions:
   (a) calculating a total layer capacity of the hardmac from a description of the hardmac design;
   (b) calculating a number of available transit connections from the total layer capacity;
   (c) calculating an absolute porosity of the hardmac from the number of available transit connections and the number of transit connections used for internal routing; and
   (d) calculating a relative porosity of the hardmac from the total metal layer capacity and the absolute porosity.

17. A computer program product for estimating porosity of a hardmac comprising:
   a medium for embodying a computer program for input to a computer; and
   a computer program embodied in the medium for causing the computer to perform the following functions:
   (a) calculating a total layer capacity of the hardmac from a description of the hardmac design;
   (b) calculating a number of available transit connections from the total layer capacity;
   (c) calculating an absolute porosity of the hardmac from the number of available transit connections and the number of transit connections used for internal routing; and
   (d) calculating a relative porosity of the hardmac from the total metal layer capacity and the absolute porosity wherein (a) includes calculating the total layer capacity substantially from the following formula:

$$TLCH = M_H \cdot \frac{W'}{G_V} \cdot \frac{H'}{G_H} = M_H \cdot W \cdot H$$

where TLCH is the total layer capacity in a horizontal direction, $G_H$ is the horizontal grid pitch, $G_V$ is the vertical grid pitch, W' is the hardmac width, H' is the hardmac height, $W=W'/G_V$, $H=H'/G_H$, and $M_H$ is the total number of metal layers in the hardmac available for horizontal transit connection routing.

18. The computer program product of claim 17 wherein includes calculating the number of available grids substantially from the following formula:

$$LCH = TLCH - IRH$$

where LCH is the number of available grids in the horizontal direction and IRH is an estimate of the maximum number of internal connections in the horizontal direction.

19. The computer program product of claim 18 wherein (c) includes calculating an absolute porosity in the horizontal direction substantially from the following formula:

$$PH = \frac{K \cdot LCH}{W} = K \cdot \left( M_H \cdot H - \frac{IRH}{W} \right)$$

where K is an empirical coefficient.

20. The computer program product of claim 19 wherein (d) includes calculating a relative porosity in the horizontal direction substantially from the following formula:

$$PRH = \frac{PH \cdot W \cdot 100\%}{TLCH}$$

21. The computer program product of claim 20 wherein (a) includes calculating the total layer capacity substantially from the following formula:

$$TLCV = M_V \cdot \frac{W' - 2 \cdot N_{PC} \cdot W_P}{G_V} \cdot \frac{H'}{G_H} = M_V \cdot W \cdot H$$

where $M_V$ is the total number of metal layers available in the hardmac for vertical transit connection routing, $N_{PC}$ is the number of placement columns, and $W_P$ is the width of a power rail inside the hardmac.

22. The computer program product of claim 21 wherein (b) includes calculating the number of available grids substantially from the following formula:

$$LCY = TLCV - IRV$$

where LCV is the number of available grids in a vertical direction and IRV is an estimate of the maximum number of internal connections in the vertical direction.

23. The computer program product of claim 22 wherein (c) includes calculating an absolute porosity in the vertical direction substantially from the following formula:

$$PV = \frac{K \cdot LCV}{H} = K \cdot \left( M_V \cdot W - \frac{IRV}{H} \right).$$

24. The computer program product of claim 23 wherein (d) includes calculating a relative porosity in the vertical direction substantially from the following formula:

$$PRV = \frac{PV \cdot H \cdot 100\%}{TLCV}.$$

25. A computer program product for estimating porosity of a hardmac comprising:
   a medium for embodying a computer program for input to a computer; and a computer program embodied in the medium for causing the computer to perform the following functions:
(a) calculating a total layer capacity of the hardmac from a description of the hardmac design;
(b) calculating a number of available transit connections from the total layer capacity;
(c) calculating an absolute porosity of the hardmac from the number of available transit connections and the number of transit connections used for internal routing; and
(d) calculating a relative porosity of the hardmac from the total metal layer capacity and the absolute porosity wherein (c) includes estimating a number of transit connections used for internal routing substantially from the following formula:

$$IRH = K \cdot K_G \cdot L_{CH}$$

where IRH is the number of transit connections used for internal routing in a horizontal direction, K is an empirical constant, $K_G$ is a gate complexity coefficient, and $L_{CH}$ is the total length of all horizontal connections.

26. The computer program product of claim 25 wherein the gate complexity coefficient $K_G$ is calculated substantially from the following formula:

$$K_G = 1 + \sum_{factor} W_{factor} \cdot Normalize(factor)$$

where each factor is calculated from a seglen file, Normalize (factor) is a function that normalizes the value of each factor such that $0 \leq Normalize(factor) \leq 1$, $W_{factor}$ is an importance weight of each factor such that $0 \leq W_{factor} \leq 1$, and the sum of $W_{factor}$ for all factors is equal to one.

27. A computer program product for estimating porosity of a hardmac comprising:
a medium for embodying a computer program for input to a computer; and
a computer program embodied in the medium for causing the computer to perform the following functions:
(a) calculating a total layer capacity of the hardmac from a description of the hardmac design;
(b) calculating a number of available transit connections from the total layer capacity;
(c) calculating an absolute porosity of the hardmac from the number of available transit connections and the number of transit connections used for internal routing; and
(d) calculating a;relative porosity of the hardmac from the total metal layer capacity and the absolute porosity wherein (c) includes estimating a number of transit connections used for internal routing substantially from the following formula:

$$IRV = K \cdot K_G \cdot L_{CV}$$

where IRV is the number of transit connections used for internal routing in a vertical direction, K is an empirical constant, $K_G$ is a gate complexity coefficient, and $L_{CV}$ is the total length of all vertical connections.

28. The computer program product of claim 27 wherein the gate complexity coefficient $K_G$ is calculated substantially from the following formula:

$$K_G = 1 + \sum_{factor} W_{factor} \cdot Normalize(factor)$$

where each factor is calculated from a seglen file, Normalize (factor) is a function that normalizes the value of each factor such that $0 \leq Normalize(factor) \leq 1$, $W_{factor}$ is an importance weight of each factor such that $0 \leq W_{factor} \leq 1$, and the sum of $W_{factor}$ for all factors is equal to one.

29. The computer program product of claim 16 further comprising adjusting a coefficient to vary calculated values of the relative porosity such that the relative porosity has a maximum value for which the hardmac may be routed by a place and route tool.

30. The computer program product of claim 16 further comprising characterizing the hardmac in a cell library by the relative porosity.

* * * * *